(12) United States Patent
Dolan

(10) Patent No.: US 9,155,221 B2
(45) Date of Patent: Oct. 6, 2015

(54) DIGITAL SUBSCRIBER LINE ACCESS MULTIPLEXER ENCLOSURES HAVING ONBOARD POWER

(71) Applicant: Emerson Network Power, Energy Systems, North America, Inc., Warrenville, IL (US)

(72) Inventor: Lawrence S. Dolan, Carol Stream, IL (US)

(73) Assignee: Emerson Network Power, Energy Systems, North America, Inc., Warrenville, IL (US)

( * ) Notice: Subject to any disclaimer, the term of this patent is extended or adjusted under 35 U.S.C. 154(b) by 50 days.

(21) Appl. No.: 13/801,156

(22) Filed: Mar. 13, 2013

(65) Prior Publication Data

US 2014/0268566 A1 Sep. 18, 2014

(51) Int. Cl.
| H05K 5/00 | (2006.01) |
| H05K 7/00 | (2006.01) |
| G06F 1/16 | (2006.01) |
| G08B 1/00 | (2006.01) |
| H04Q 1/30 | (2006.01) |
| G08B 1/08 | (2006.01) |
| H05K 7/20 | (2006.01) |
| H05K 5/02 | (2006.01) |
| G06F 1/18 | (2006.01) |

(52) U.S. Cl.
CPC .............. *H05K 7/20127* (2013.01); *H05K 5/02* (2013.01); *H05K 7/20* (2013.01); *G06F 1/18* (2013.01); *G06F 1/189* (2013.01)

(58) Field of Classification Search
CPC .......... G06F 1/18; G06F 1/181; G06F 1/182; G06F 1/189; H05K 7/20; H05K 7/20127

USPC .................... 361/679.01, 724, 725, 726, 727; 340/531, 539.1

See application file for complete search history.

(56) References Cited

U.S. PATENT DOCUMENTS

| 6,748,078 B1 | 6/2004 | Posthuma |
| 6,875,110 B1 * | 4/2005 | Crumby ......................... 463/42 |
| 7,116,761 B2 | 10/2006 | Ashton et al. |

(Continued)

FOREIGN PATENT DOCUMENTS

| CN | 201398267 | 2/2010 |
| JP | 2003264645 | 9/2003 |

(Continued)

OTHER PUBLICATIONS

MMOE—Telecom Outdoor Enclosure; Alpha Technologies, 2011, 2 pages.

(Continued)

*Primary Examiner* — Anthony Haughton
(74) *Attorney, Agent, or Firm* — Harness, Dickey & Pierce, P.L.C.

(57) ABSTRACT

A system includes a digital subscriber line access multiplexer (DSLAM) enclosure having a power area for housing power components and a component area for housing components configured to receive power from the power components. The system further includes at least one DSLAM positioned in the component area of the DSLAM enclosure and an AC power supply for providing AC power to the at least one DSLAM. The AC power supply is positioned in the power area of the DSLAM enclosure.

11 Claims, 3 Drawing Sheets

(56) References Cited

U.S. PATENT DOCUMENTS

| | | |
|---|---|---|
| 7,995,747 B2 | 8/2011 | Johnson et al. |
| 8,365,018 B2 | 1/2013 | McIntosh et al. |
| 8,842,999 B2 | 9/2014 | Kim et al. |
| 2004/0095956 A1 | 5/2004 | Henderson et al. |
| 2008/0181393 A1 | 7/2008 | Brost et al. |
| 2008/0265673 A1* | 10/2008 | Ross .................. 307/19 |
| 2009/0096603 A1* | 4/2009 | Langsweirdt et al. ..... 340/539.1 |
| 2010/0046940 A1 | 2/2010 | Cotton et al. |
| 2010/0167822 A1* | 7/2010 | Crumby ..................... 463/42 |
| 2011/0267782 A1* | 11/2011 | Petrick et al. .............. 361/724 |
| 2014/0160686 A1* | 6/2014 | Benson et al. ............. 361/724 |

FOREIGN PATENT DOCUMENTS

| | | |
|---|---|---|
| WO | 00/34836 | 6/2000 |
| WO | 2009/068866 | 6/2009 |

OTHER PUBLICATIONS

Compact Uninterruptable Power Supply (UPS); STS Rail, 2009, 1 page.

* cited by examiner

DIGITAL SUBSCRIBER LINE ACCESS MULTIPLEXER ENCLOSURES HAVING ONBOARD POWER

FIELD

The present disclosure relates to digital subscriber line access multiplexer enclosures having onboard power.

BACKGROUND

This section provides background information related to the present disclosure which is not necessarily prior art.

Digital subscriber line access multiplexers (DSLAMs) are typically housed in an enclosure that receives electric power from an external power supply. The external power supply is typically housed in a separate enclosure. The external power supply may be coupled to a plurality of DSLAM enclosures for providing electric power thereto.

SUMMARY

This section provides a general summary of the disclosure, and is not a comprehensive disclosure of its full scope or all of its features.

According to one aspect of the present disclosure, a system includes a DSLAM enclosure having a power area for housing power components and a component area for housing components configured to receive power from the power components. The system further includes at least one DSLAM positioned in the component area of the DSLAM enclosure and an AC power supply for providing AC power to the at least one DSLAM. The AC power supply is positioned in the power area of the DSLAM enclosure.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Figure 1:
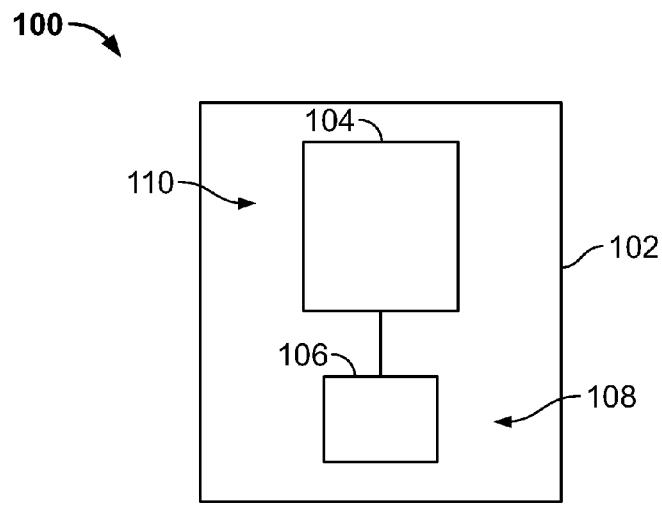
FIG. 1 is a block diagram of a system having a DSLAM enclosure including a DSLAM and a power supply according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

A system according to one example embodiment of the present disclosure is illustrated in FIG. 1 and indicated generally by reference number 100. As shown in FIG. 1, the system 100 includes a DSLAM enclosure 102, a digital subscriber line access multiplexer (DSLAM) 104, and an AC power supply 106 for providing AC power to the DSLAM 104. The DSLAM enclosure 102 includes a power area 108 for housing power components and a component area 110 for housing components that receive power from the power components. The DSLAM 104 is positioned in the component area 110 of the DSLAM enclosure 102 and the AC power supply 106 is positioned in the power area 110 of the DSLAM enclosure 102.

By positioning the power supply 106 within the DSLAM enclosure 102, the system 100 includes onboard power for the DSLAM 104. This in turn eliminates the need for external power supply(ies) housed in an enclosure (e.g., pedestal enclosure) separate from the DSLAM enclosure 102. By eliminating the need for external power supply(ies), the number of enclosures are reduced thereby unburdening land (e.g., right-of-ways, etc.) that would otherwise be used by the additional enclosures, making land more aesthetically pleasing, etc.

Additionally, by positioning the power supply 106 within the DSLAM enclosure 102, materials including, for example, power cables from an external power supply to the DSLAM 104, concrete pads, pedestals, etc. may be reduced. Further, time spent on site preparation may be reduced (and in some cases eliminated). For example, digging a trench for cables from an external power supply, leveling the site for an external power supply, etc. may not be needed if a power supply is positioned within a DSLAM enclosure.

The AC power supply 106 may be any suitable AC power supply that provides AC power (e.g., 120 VAC). In some embodiments, the AC power supply 106 includes an uninterruptible power supply (UPS). By employing an UPS, backup AC power may be provided to the DSLAM 104 in the event the AC power supply 106 stops receiving power (e.g., from a utility outage, brownout, etc.) to provide to the DSLAM 104. Preferably, the UPS provides backup AC power for at least ten (10) minutes. Alternatively, if desired, the UPS may provide backup AC power for time period more or less than ten (10) minutes.

By employing an UPS, chances of the DSLAM 104 losing power is reduced. If the DSLAM 104 loses power, the DSLAM 104 must reboot thereby interrupting service (e.g., telephone, internet, and/or video services) provided to customers from the DSLAM 104. In some cases, the DSLAM 104 may take anywhere from a few minutes to several hours to reboot.

As shown in FIG. 1, the power area 108 is below the component area 110. Thus, the AC power supply 106 (in the power area 108) is positioned below the DSLAM 104 (in the component area 110). However, it should be understood that the power area 108 and the component area 110 may be positioned in any suitable manner relative to each other. Accordingly, the AC power supply 106 may be above, to the side of, etc. the DSLAM 104 depending on the position of the power area 108 and the component area 110.

In the example of FIG. 1, the power area 108 (including the AC power supply 106) is not physically separated from the component area 110 (including the DSLAM 104). However, it should be understood that the system 100 may include a structure (e.g., a wall, an enclosure, etc.) to physically separate the power area 108 from the component area 110. For example, the system 100 may include an additional enclosure for housing the AC power supply 106 (or any other additional components in the power area 108). Such an enclosure is shown in FIGS. 2A-E (sometimes collectively referred to as FIG. 2) and described below.

In the example of FIG. 1, the DSLAM 104 is a hardened DSLAM. Additionally, although the example of FIG. 1 only illustrates one DSLAM 104 positioned in the component area 110 of the DSLAM enclosure 102, multiple DSLAMs may be employed without departing from the scope of the present disclosure. For example, the system 100 may include two or more DSLAMs.

Figure 2A:
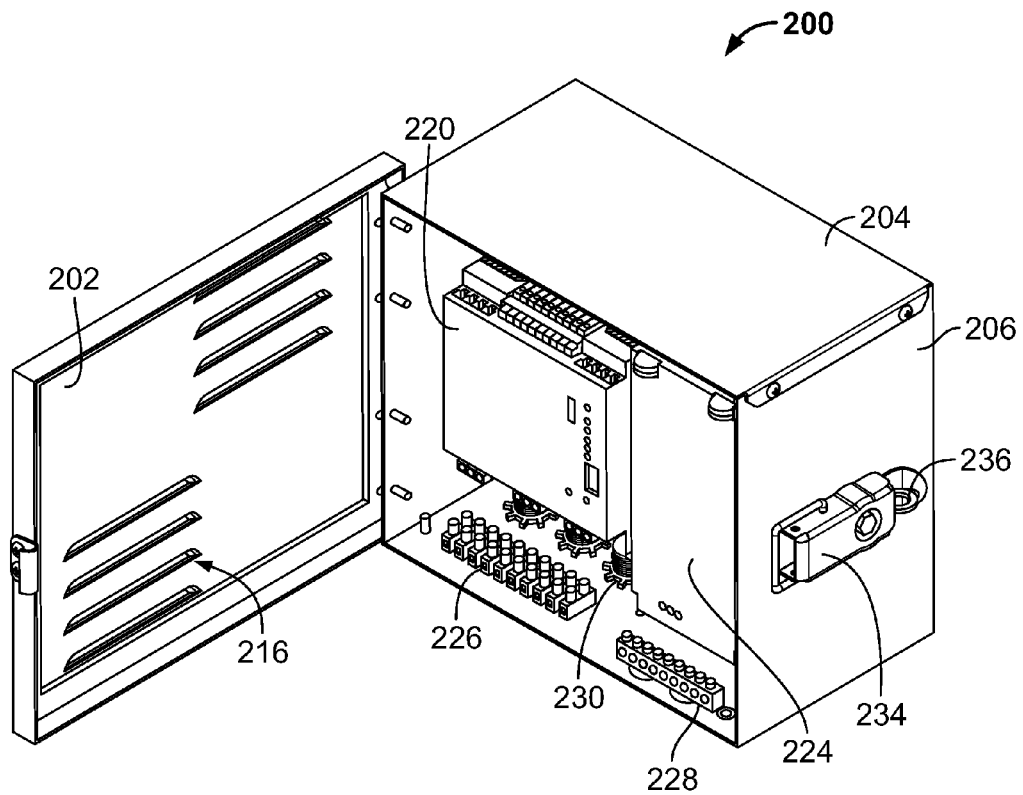
FIG. 2A is a front isometric view of a power supply enclosure including a power supply according to another example embodiment.

FIGS. 2A-E illustrate multiple views of a power supply enclosure 200. As shown in FIG. 2A, the power supply enclosure 200 includes an AC power supply 220 positioned within the power supply enclosure 200. The AC power supply 220 provides AC power to one or more DSLAMs (not shown in FIG. 2) positioned external to the power supply enclosure 200. In this way, the AC power supply 220 (which is self-contained within the power supply enclosure 200) may be isolated from the DSLAMs via the power supply enclosure 200.

In the example of FIG. 2, the AC power supply 220 includes a UPS having a backup battery 224. The backup battery 224 provides power to the UPS so that the AC power supply 220 may provide backup AC power to the one or more DSLAMs in the event the AC power supply 220 stops receiving power as explained above.

In the example of FIG. 2, the AC power supply 220 has nominal input and output voltages of 120 VAC, and may operate in ambient temperatures between about −25 degrees Celsius to about 70 degrees Celsius. The backup battery 224 has an output voltage of 24 VDC and a capacity of 3.4 AH. The capacity of the backup battery 224, however, may be subject to variation depending on DSLAM specifications. The backup battery 224 may be a valve-regulated lead-acid battery (e.g., an absorbed glass mat battery) or any other suitable rechargeable battery. Alternatively, any suitable AC power supply and/or backup battery may be employed without departing from the scope of the present disclosure.

The AC power supply 220 may be attached to the power supply enclosure 200 via one or brackets (e.g., DIN brackets, etc.), rivets, screws, bolts, etc. For example, if appropriate brackets are employed, the AC power supply 220 may be installed, replaced, etc. with relative ease thereby reducing time spent on such tasks.

The power supply enclosure 200 includes walls 202, 204, 206, 208, 210, 212 coupled together to form a generally rectangular shaped cube. The walls 204, 206, 208, 210, 212 may be coupled together by any suitable means including, for example, by rivets (as shown in FIG. 2), screws, bolts, welding adjacent walls together, etc.

In the example of FIG. 2, the wall 202 is a door and is coupled to the wall 208 via two hinges 218. Alternatively, the wall 202 (sometimes referred to as a door 202) may be coupled to the wall 208 (or any one of the walls 204, 206, 212) via more or less than two hinges 218 or by any other suitable means.

Figure 2B:
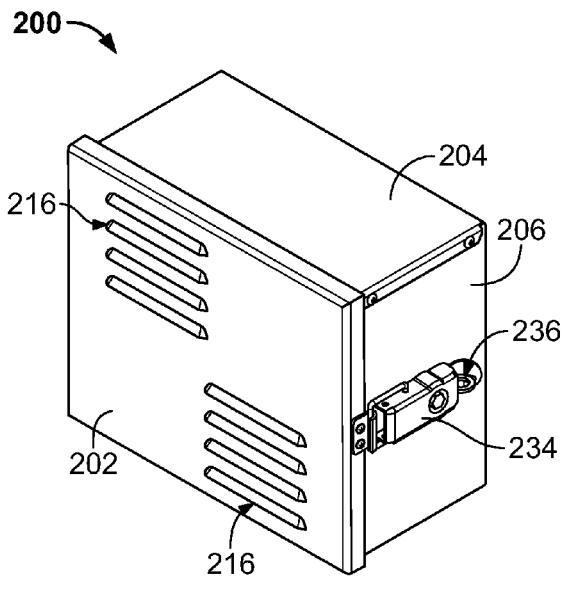
FIG. 2B is a front isometric view of the power supply enclosure of FIG. 2A illustrating a door of the power supply enclosure closed.

As shown best in FIG. 2B, the power supply enclosure 200 includes a locking system 234 to ensure the door 202 is secured shut. In the example of FIG. 2, the locking system 234 includes a universal lock (e.g., requiring a B-216 type tool to unlock) and a hasp 236 to secure (e.g. via padlock, combination lock, etc.) the locking system 234. In this way, the locking system 234 includes tamper resistant identification by only allowing a user access to the power supply enclosure 200 if the user has appropriate tools (e.g., the B-216 tool, a key, a combination, etc.).

As shown best in FIGS. 2A and 2B, the door 202 includes venting for cooling the AC power supply 220. In the example of FIG. 2, the venting may include two arrays of louvers 216. Alternatively, the door 202 may include more or less arrays of louvers or any other suitable means for venting air to cool the AC power supply 220. Additionally, although not shown in FIG. 2, any of the walls 204, 206, 208, 210, 212 may include one or more arrays of louvers or alternative means for venting air to cool the AC power supply 220.

In the example of FIG. 2, the power supply enclosure 200 only employs passive cooling for regulating a temperature within the power supply enclosure 200. In this way, the temperature within the power supply enclosure 200 is regulated without the use of components (e.g., fans, pumps, etc.) consuming power. For example, by employing the louvers 216 (and/or alternative means for venting air), reducing solar loading on the power supply enclosure 200 (as further explained below), etc., temperature within the power supply enclosure 200 may be regulated.

Alternatively, in other embodiments, active means to cool the power supply enclosure 200 may be employed if desired. For example, the power supply enclosure 200 may further include one or more fans requiring power to assist in cooling the power supply enclosure 200.

As shown in FIG. 2A, terminal blocks 226, 228 are positioned within the power supply enclosure 200. More particularly, the terminal blocks 226, 228 are positioned below the AC power supply 220 and attached to the interior side of wall 212. Alternatively, the terminals blocks 226, 228 may be positioned at any suitable location within the power supply enclosure 200 and/or attached to any of the walls of the power supply enclosure 200. Additionally, although only two terminal blocks 226, 228 are shown in FIG. 2, more or less terminals blocks may be employed without departing from the scope of the present disclosure.

The terminal blocks 226, 228 may be employed for power connections, grounding, etc. For example, the terminal block 226 may receive an output of the AC power supply 220 and provide power connections to one or more DSLAMs. In this way, the terminal block 226 provides clear and concise points of demarcation for power to the DSLAMs. Additionally, the terminal block 228 may be employed for a point of access for grounding.

Figure 2C:
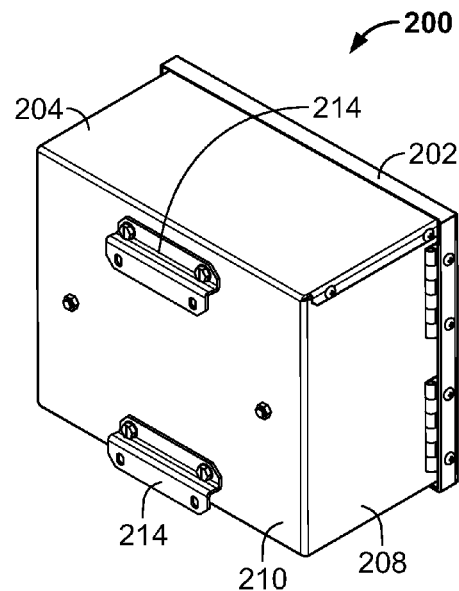
FIG. 2C is a rear isometric view of the power supply enclosure of FIG. 2A.
Figure 2D:
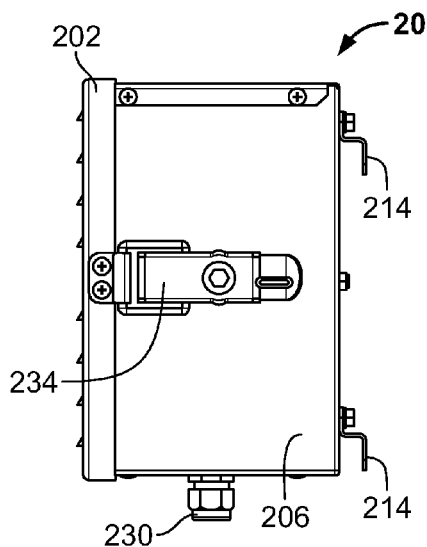
FIG. 2D is side view of the power supply enclosure of FIG. 2A.
Figure 2E:
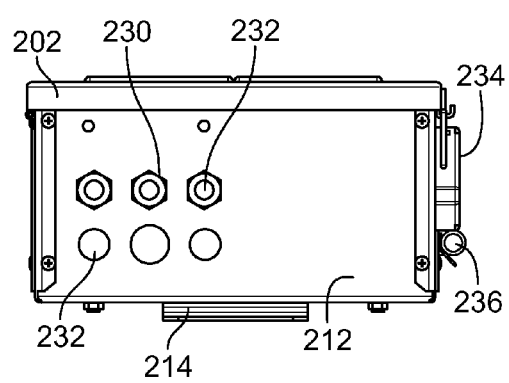
FIG. 2E is a bottom view of the power supply enclosure of FIG. 2A.

As shown best in FIG. 2E, the power supply enclosure 200 includes apertures 232 for receiving an input (e.g., one or more cables) to the AC power supply 220 and/or outputs to the DSLAMs (e.g., from the terminal block 226). As shown in FIG. 2E, the apertures 232 may have different dimensions to accommodate different sized cables, more than one cable, etc. The apertures 232 are positioned below the AC power supply 220 and may be formed from knockouts positioned in the wall 212.

Alternatively, the apertures 232 may be positioned at any suitable location within the power supply enclosure 200 to allow a user to customize the power supply enclosure 200 for a particular wiring scheme. For example, the apertures 232 may be formed in any one of the walls, two or more walls, etc. Additionally, although FIG. 2 illustrates six apertures 232, the power supply enclosure 200 may include more or less apertures.

As shown in FIGS. 2A, 2D and 2E, some of the apertures 232 include fittings 230 to ensure water or other undesirable objects are restricted from entering the power supply enclosure 200 through the apertures 232. Although only three apertures 232 include the fitting 230, it should be understood that all or none of the apertures 232 may include a fitting.

As shown best in FIG. 2C, the power supply enclosure 200 includes brackets 214 for adjustably attaching the power supply enclosure 200 to another enclosure (e.g., the DSLAM enclosure 100 of FIG. 1). For example, if the other enclosure includes an appropriate bracket (e.g., rails, etc.), the power supply enclosure 200 may be moveable in a horizontal direction (e.g., along the rails). In this way, the power supply enclosure 200 may be utilized in a wide variety of enclosures having different internal cabling schemes. Additionally by allowing the power supply enclosure 200 to move, the power supply enclosure 200 may be installed, replaced, etc. with relative ease thereby reducing time spent on such tasks.

Figure 3:
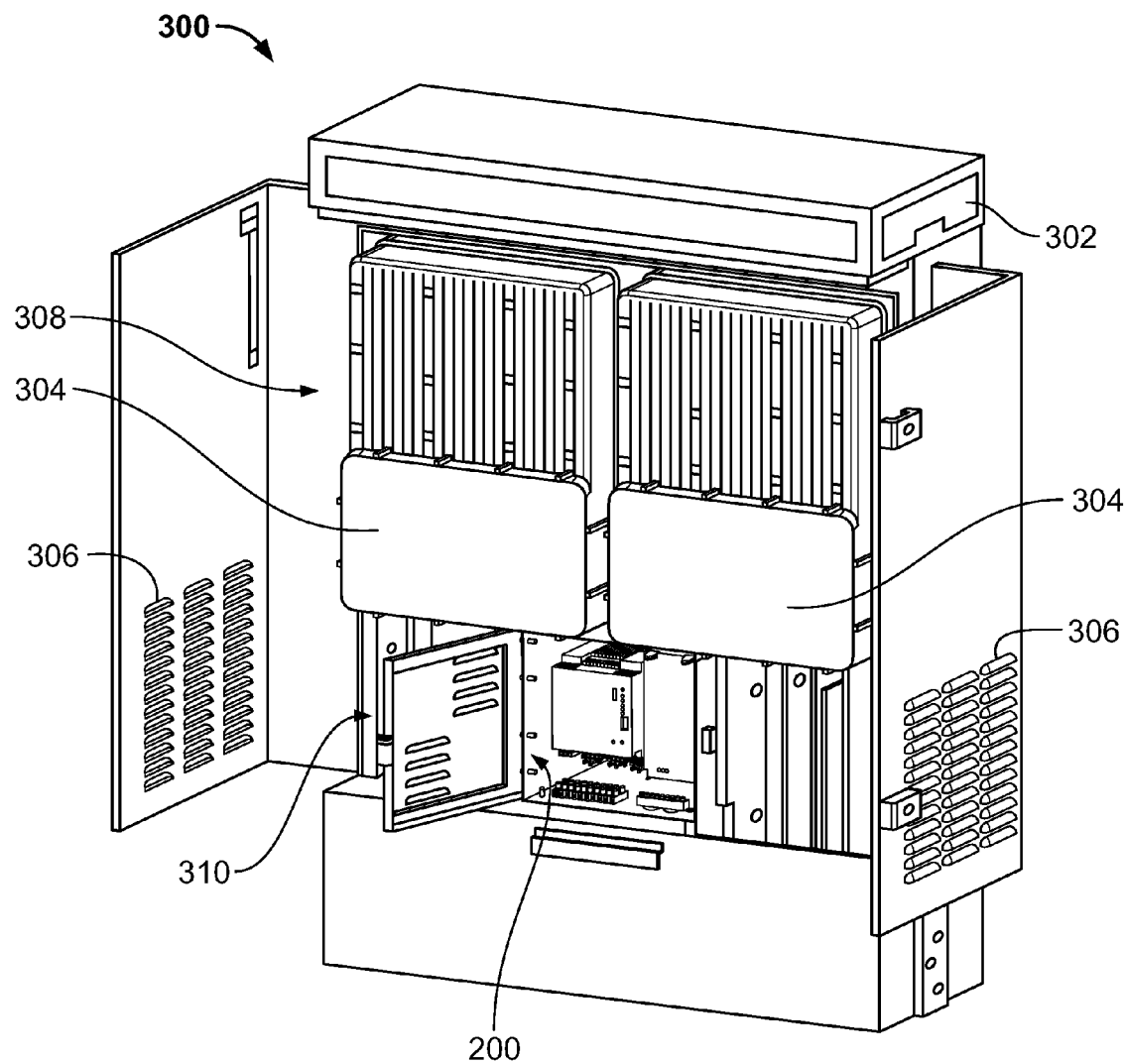
FIG. 3 is a front isometric view of a system having a DSLAM enclosure including multiple DSLAMs and the power supply enclosure of FIGS. 2A-E according to another example embodiment.

FIG. 3 illustrates an example system 300 including a DSLAM enclosure 302 having a component area 308 and a power area 310 below the component area 308. In the example of FIG. 3, the DSLAM enclosure 302 is an outside the plant (OSP) enclosure. The system 300 further includes DSLAMs 304 positioned in the component area 308 and the power supply enclosure 200 of FIG. 2 positioned in the power area 310. Accordingly, the power supply enclosure 200 is positioned below the DSLAMs 304.

In the example of FIG. 3, the system 300 includes four hardened DSLAMs 304, two of which are shown in FIG. 3. The other two hardened DSLAMs (not shown) are positioned on an opposing side of the DSLAM enclosure 302.

As shown in the example of FIG. 3, the DSLAM enclosure 302 includes venting for cooling the DSLAMs 304 and the AC power supply 220 within the power supply enclosure 200. In the example of FIG. 3, the venting includes arrays of louvers 306. As shown in FIG. 3, each door of the DSLAM enclosure 302 includes three arrays of louvers 306. This enables the DSLAM enclosure 302 to employ passive (e.g., uncontrolled) cooling for regulating the temperature within the DSLAM enclosure 302 and/or the power supply enclosure 200.

Additionally, although not shown, the DSLAM enclosure 302 includes one or more brackets for mating with the brackets 214 (as explained above) of the power supply enclosure 200.

By positioning the power supply enclosure 200 within the DSLAM enclosure 302, solar loading on the power supply enclosure 200 is reduced (if not eliminated). This, in part, enables the supply enclosure 200 only to employ passive cooling for regulating the temperature within the power supply enclosure 200 as explained above.

Additionally, by positioning the power supply enclosure 200 within the DSLAM enclosure 302, the power supply enclosure 200 is substantially climate controlled. For example, the power supply enclosure 200 (including the AC power supply 220) is substantially protected from water, wind, dust, debris, etc. by the DSLAM enclosure 302. In this way, the power supply enclosure 200 does not require a sealed architecture to protect the AC power supply 220 from water, wind, dust, debris, etc.

The power supply enclosures and/or the power supplies disclosed herein may be installed in an existing DSLAM enclosure including DSLAMs. For example, a DSLAM enclosure previously installed in a right-of-way may be modified (e.g., to include appropriate brackets) so that a power supply enclosure may be installed.

The DSLAM enclosures and/or the power supply enclosures disclosed herein may be any suitable material including, for example, a metallic, plastic, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A system comprising:
    an outdoor digital subscriber line access multiplexer (DSLAM) enclosure, the outdoor DSLAM enclosure including a plurality of DSLAM enclosure walls, a power area for housing power components, and a component area for housing components configured to receive power from the power components, at least one wall of the plurality of DSLAM enclosure walls including a vent for cooling the power area;
    at least one DSLAM positioned in the component area of the DSLAM enclosure; and
    a power supply enclosure positioned in the power area of the DSLAM enclosure, the power supply enclosure including a plurality of power supply enclosure walls and an AC power supply for providing AC power to the at least one DSLAM, at least one wall of the plurality of power supply enclosure walls including a vent for cooling the AC power supply.

2. The system of claim 1 wherein the system includes a plurality of DSLAMs positioned in the component area.

3. The system of claim 1 wherein the AC power supply includes an uninterruptible power supply.

4. The system of claim 1 wherein the AC power supply is positioned below the at least one DSLAM.

5. The system of claim 1 wherein the AC power supply is isolated from the at least one DSLAM via the power supply enclosure.

6. The system of claim 1 further comprising at least one terminal block positioned within the power supply enclosure.

7. The system of claim 1 wherein the power supply enclosure only employs passive cooling for regulating a temperature within the power supply enclosure.

8. The system of claim 1 wherein the power supply enclosure includes at least one aperture for receiving a cable.

9. The system of claim 1 wherein the power supply enclosure includes a bracket for adjustably attaching the power supply enclosure to the DSLAM enclosure.

10. The system of claim 1 wherein the vent of the at least one wall of the plurality of power supply enclosure walls includes a louver.

11. The system of claim 1 wherein the vent of the at least one wall of the plurality of DSLAM enclosure walls includes a louver.

* * * * *